United States Patent
Pois et al.

(10) Patent No.: US 11,852,467 B2
(45) Date of Patent: Dec. 26, 2023

(54) METHOD AND SYSTEM FOR MONITORING DEPOSITION PROCESS

(71) Applicant: NOVA MEASURING INSTRUMENTS, INC., Santa Clara, CA (US)

(72) Inventors: Heath A. Pois, Fremont, CA (US); Laxmi Warad, Milpitas, CA (US); Srinivasan Rangarajan, Morgan Hill, CA (US)

(73) Assignee: NOVA MEASURING INSTRUMENTS, INC., Fremont, CA (US)

( * ) Notice: Subject to any disclaimer, the term of this patent is extended or adjusted under 35 U.S.C. 154(b) by 85 days.

(21) Appl. No.: 17/438,845

(22) PCT Filed: Mar. 12, 2020

(86) PCT No.: PCT/US2020/022407
§ 371 (c)(1),
(2) Date: Sep. 13, 2021

(87) PCT Pub. No.: WO2020/190643
PCT Pub. Date: Sep. 24, 2020

(65) Prior Publication Data
US 2022/0155064 A1  May 19, 2022

Related U.S. Application Data

(60) Provisional application No. 62/817,492, filed on Mar. 12, 2019.

(51) Int. Cl.
*G01B 15/02* (2006.01)
*G01N 23/2273* (2018.01)

(52) U.S. Cl.
CPC ......... *G01B 15/02* (2013.01); *G01N 23/2273* (2013.01); *G01N 2223/61* (2013.01)

(58) Field of Classification Search
CPC ............... G01B 15/02; G01N 23/2273; G01N 2223/61; G01N 2223/085; G01N 2223/303; G01N 2223/633; H01L 22/12
See application file for complete search history.

(56) References Cited

U.S. PATENT DOCUMENTS 7,375,327 B2  5/2008 Yoshiki et al.
9,201,030 B2  12/2015 deCecco et al.
(Continued)

FOREIGN PATENT DOCUMENTS

CN  106443755 A  2/2017
CN  106574904 A  4/2017
(Continued)

*Primary Examiner* — Jurie Yun
(74) *Attorney, Agent, or Firm* — WOMBLE BOND DICKINSON (US) LLP; Joseph Bach, Esq.

(57) ABSTRACT

Quantification of the passivation and the selectivity in deposition process is disclosed. The passivation is evaluated by calculating film thicknesses on pattern lines and spaces. An XPS signal is used, which is normalized with X-ray flux number. The method is efficient for calculating thickness in selective deposition process, wherein the thickness can be used as metric to measure selectivity. Measured photoelectrons for each of the materials can be expressed as a function of the thickness of the material overlaying it, adjusted by material constant and effective attenuation length. In selective deposition over a patterned wafer, the three expressions can be solved to determine the thickness of the intended deposition and the thickness of any unintended deposition over passivated pattern.

18 Claims, 2 Drawing Sheets

(56) References Cited

U.S. PATENT DOCUMENTS

| | | |
|---|---|---|
| 9,594,035 B2 | 3/2017 | Pois et al. |
| 9,632,043 B2 | 4/2017 | Mazor et al. |
| 2006/0243904 A1 | 11/2006 | Schueler |
| 2013/0077742 A1 | 3/2013 | Schueler et al. |
| 2017/0160081 A1 | 6/2017 | Pois et al. |
| 2019/0277783 A1 | 9/2019 | Larson et al. |

FOREIGN PATENT DOCUMENTS

| | | |
|---|---|---|
| JP | 3811089 B2 | 8/2006 |
| TW | 201621303 A | 6/2016 |
| WO | 2010018475 A2 | 2/2010 |
| WO | 2015200112 A1 | 12/2015 |

METHOD AND SYSTEM FOR MONITORING DEPOSITION PROCESS

RELATED APPLICATIONS

The present application is the national phase of International Application No. PCT/US2020/022407, filed on Mar. 12, 2020 which claims priority to and the benefit of U.S. Provisional Application No. 62/817,492 filed on Mar. 12, 2019, and the disclosures of which are hereby incorporated herein by reference in their entireties.

BACKGROUND

1. Field

This disclosure relates generally to the field of process control and monitoring in the semiconductor fabrication field. The disclosed process control technique is particularly suitable for monitoring selective deposition processes.

2. Related Art

For decades the semiconductor industry relied on photolithography to generate the patterning required for the chips' circuitry. Photolithography enabled depositing each layer over the entire wafer, and then patterning the layer to form the circuitry. In addition to adding many steps and cost to the chip fabrication process, current nano-scale features make photolithography incredibly difficult and, indeed, perhaps at some point impossible. Additionally, double and multi-patterning used to define nano-scale features (requiring two or more separate lithography and etch steps to define a single layer) may lead to unacceptable edge placement errors (EPE) and overlay misalignments.

An emerging technique, called Selective Deposition, deposits each layer only at the areas of the designed circuitry, thus avoiding the need for photolithography patterning. One promising example of selective deposition is the use of Atomic Layer Deposition (ALD) to repeatedly form Self-Assembly Monolayers (SAM), wherein each monolayer is deposited only at the regions of the designed circuitry. A similar technique, Molecular Layer Deposition (MLD) is used for deposition of organic materials. Generally, the top surface of the substrate has a dielectric pattern, a metal pattern, and possibly a semiconductor pattern, and the next layer to be formed may be a metal layer over the metal pattern, a dielectric layer over the dielectric pattern, or a semiconductor over the semiconductor pattern. This may require area activation or area deactivation (passivation) prior to the next layer's formation. The ALD deposition using SAM with surface passivation may be a promising technique as it both avoids the photolithography step and uses the surface's chemistry to make the alignments, thus preventing EPE and overlay errors.

Regardless of which technique is used, metrology and process control tools will be required in order to implement an integrated process with acceptable yield. However, to date no suitable metrology tools have been developed for process monitoring and qualification. The conventional tools used in the labs today for investigating these processes include Scanning Electron Microscopy (SEM), Atomic Force Microscopy (AFM) and Tunneling Electron Microscopy (TEM). These tools are too slow to be employed in a production environment, and are incapable of providing real-time monitoring of the process, so as to indicate a drift or a failure of the process in a commercial fabrication setting.

X-ray photoelectron spectroscopy (XPS) has been used to analyze surface chemistry of substrates. XPS spectra are obtained by irradiating the substrate with a beam of X-rays, while simultaneously measuring the kinetic energy and number of electrons that escape from the top layers of the substrate. Similarly, X-ray fluorescence (XRF) has been widely used for elemental and chemical analysis of samples, by sampling the emission of characteristic "secondary" (or fluorescent) X-rays from a material that has been excited by bombarding with high-energy X-rays or gamma rays.

3. Problem to be Solved

In order to enable selective deposition in commercial fabrication environment, a need exists in the art for process monitoring and control. The methodology should provide fast, direct, and non-destructive measurements of the quality of the process on the wafer, to enable analysis of process quality and detection of process drift.

SUMMARY

The following summary of the disclosure is included in order to provide a basic understanding of some aspects and features of the invention. This summary is not an extensive overview of the invention and as such it is not intended to particularly identify key or critical elements of the invention or to delineate the scope of the invention. Its sole purpose is to present some concepts of the invention in a simplified form as a prelude to the more detailed description that is presented below.

Disclosed embodiments enable analyzing and monitoring deposition and/or passivation processes, especially in the context of selective deposition. The embodiments also enable quantifying the quality of the process and identifying process drifts or predicting required maintenance of the deposition equipment. As such, the embodiments enable the implementation of selective deposition in a commercial fabrication environment.

In the disclosed embodiments, XPS measurements are used to analyze the thickness of layers formed during selective deposition. The measurements can be implemented during different steps of the selective deposition, e.g., to analyze the quality of the passivation, the quality of the deposited layer, the presence of deposited material over the passivated areas, the presence of pinholes, etc. As such, the disclosed embodiments help ensure that material is deposited properly in areas where it should be deposited, and that no material is deposited where it should not be deposited.

Examples disclosed herein illustrate the use of XPS intensities to determine metrics for process results, such as thickness of the layer, passivation and degree of selectivity.

In the context of selective deposition process, disclosed embodiments enable quantification of the passivation and the selectivity. In one aspect, the passivation is evaluated by calculation of film thicknesses on pattern lines and spaces. In disclosed embodiments an XPS signal is used, which is normalized with X-ray flux number. This method is efficient for calculating thickness in selective deposition process. The thickness can be used as metric to measure selectivity. This eliminates the need of blanket wafer data for reference selectivity number.

Example of embodiments implement measuring the thickness (or an approximation of the thickness) of the ALD oxide, either on the metal or on the underlying oxide, such as $SiO_2$.

Aspects of the disclosure include a method for monitoring deposition process, comprising: providing a sample having a first layer of a first material deposited over a second layer of a second material, the second layer having a pattern of a third material therein; generating an X-ray beam and directing the X-ray beam towards the sample to irradiate the sample; intercepting part of the X-ray beam with an X-ray detector to generate an X-ray flux value; collecting electrons emitted from the sample and separating the electrons according to electron energies; determining electron count for each of the electron energies; and determining the presence of the first material over the pattern of the third material by using the X-ray flux value to normalize the electron count of electron energies corresponding to electrons emitted from the pattern of the third material, and comparing resulting normalized electron count to reference electron count. The method may include obtaining a ratio of the resulting normalized electron count to reference electron count and additionally determining the thickness of the first layer over the pattern by scaling a natural log of the ratio. Scaling may include multiplying by an effective attenuation length of photoelectrons emitted from the third material and traveling through the first material. Similarly, determining the thickness of the first layer over the second material can be done by using the X-ray flux value to normalize the electron count of electron energies corresponding to electrons emitted from the second material, and applying a correction factor.

Further aspects include a method for monitoring deposition process, comprising: providing a sample having a first layer of a first material deposited over a second layer of a second material, the second layer having a pattern of a third material therein; generating an X-ray beam and directing the X-ray beam towards the sample to irradiate the sample; collecting electrons emitted from the sample and separating the electrons according to electron energies; determining electron count for electron energies corresponding to electrons emitted from species of the first material, second material and third material; using the electron count to generate intensity values $I_1$, $I_2$ and $I_3$, corresponding to photo electrons emitted from the first, second and third materials, respectively; expressing model value of electrons emitted from species of the first material as $I'_1$, corresponding to a sum of a first contribution correlated to the thickness of the thick part and second contribution correlated to the thickness of the thin part, wherein a material constant of the first material and an effective attenuation length of the first material is applied to each of the first contribution and the second contribution; expressing model value of electrons emitted from species of the second material as $I'_2$, corresponding to thickness of the thick part and adjusted by a material constant of the second material and an effective attenuation length of the second material; expressing model value of electrons emitted from species of the third material as $I'_3$, corresponding to thickness of the thin part and adjusted by a material constant of the third material and an effective attenuation length of the third material; and using the intensity values $I_1$, $I_2$ and $I_3$ and models values $I'_1$, $I'_2$ and $I'_3$ to obtain the thickness of the thick part and the thickness of the thin part. The method may also include applying the material constant to an exponent of the ratio of the thickness over the effective attenuation length.

In further aspects, a system for monitoring a deposition process is provided, comprising: a stage supporting a wafer; an X-ray source generating an X-ray beam radiating the wafer over at least an area of the wafer having a first layer of a first material deposited over a second layer of a second material, the second layer having a pattern of a third material therein; an X-ray sensor intercepting part of the X-ray beam and generating X-ray Flux signal; an electron analyzer spatially dividing electrons emitted from the wafer according to different electron energies; an electron detector detecting the electrons after passing through the electron analyzer and outputting detection signal; and a processor receiving the detection signal and determining therefrom signal intensity for electrons in energy band corresponding to electrons emitted from the third material, and normalizing signal intensity using the X-ray Flux signal to identify the presence of the first material over the pattern of the third material.

BRIEF DESCRIPTION OF THE DRAWINGS

Other aspects and features of the invention would be apparent from the detailed description, which is made with reference to the following drawings. It should be appreciated that the detailed description and the drawings provides various non-limiting examples of various embodiments of the invention, which is defined by the appended claims.

The accompanying drawings, which are incorporated in and constitute a part of this specification, exemplify the embodiments of the present invention and, together with the description, serve to explain and illustrate principles of the invention. The drawings are intended to illustrate major features of the exemplary embodiments in a diagrammatic manner. The drawings are not intended to depict every feature of actual embodiments nor relative dimensions of the depicted elements, and are not drawn to scale.

FIG. 1 is a partial cross-section of a selective deposition structure illustrating the measurements according to disclosed embodiments, while

DETAILED DESCRIPTION

Embodiments of the inventive deposition process control and monitoring will now be described with reference to the drawings. Different embodiments or their combinations may be used for different applications or to achieve different benefits. Depending on the outcome sought to be achieved, different features disclosed herein may be utilized partially or to their fullest, alone or in combination with other features, balancing advantages with requirements and constraints. Therefore, certain benefits will be highlighted with reference to different embodiments, but are not limited to the disclosed embodiments. That is, the features disclosed herein are not limited to the embodiment within which they are described, but may be "mixed and matched" with other features and incorporated in other embodiments.

Figure 1A:
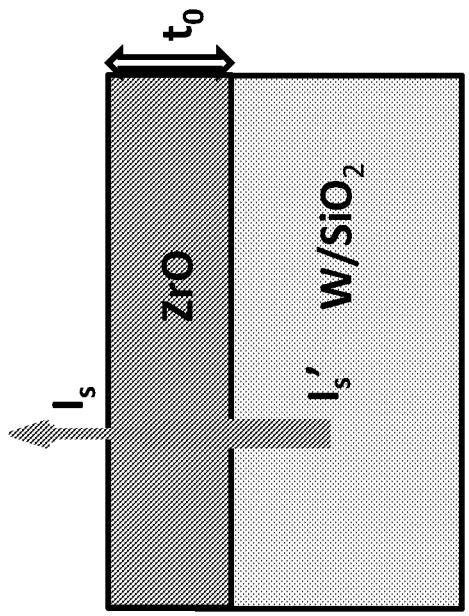
FIG. 1A is a schematic illustrating an embodiment of determining layer thickness.
Figure 1:
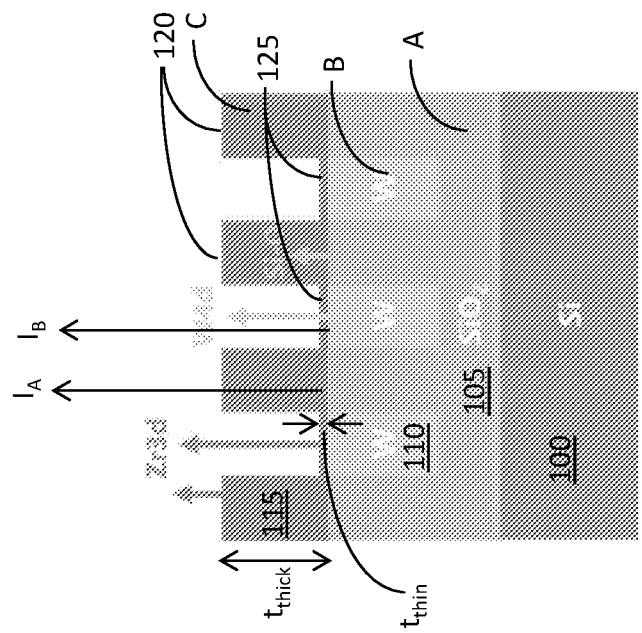

FIG. 1 illustrates a cross-section of a part of a semiconductor wafer, demonstrating monitoring of a deposition process, e.g., a selective deposition process. The base layer 100, e.g., a wafer substrate, is made of silicon, and a layer of an insulator 105 is deposited over it, in this example silicon-dioxide layer. The silicon-dioxide layer 105 is patterned by having a plurality of holes or trenches 110 that are filled with conductive metal, in the illustrated example tungsten, W. A second layer of insulator 115 is to be deposited selectively only over the exposed parts of insulating layer 105. In the example of FIG. 1 a layer of zirconium-dioxide is to be deposited selectively only over the exposed parts of the silicon-dioxide layer. For illustration, the illustration of FIG. 1 shows that a layer of zirconium-dioxide layer is indeed deposited over the silicon-dioxide layer; however, an unwanted thin layer of zirconium-dioxide is also deposited over exposed parts of the tungsten layer. An uneven layer of zirconium dioxide 115 is deposited over the silicon dioxide and tungsten.

According to one embodiment, XPS is used to monitor the selectivity of the deposition process, i.e., to determine whether any insulating layer is being deposited over the exposed parts of the metal layer. Referring to the example of FIG. 1, in the embodiment XPS is used to determine whether zirconium-dioxide is being deposited over the exposed parts of the tungsten layer and, if so, the thickness of such unwanted deposition.

In one example, the sample illustrated in FIG. 1 is irradiated with x-rays and the resulting photo electron emission (illustrated by arrows) from the sample is examined. In this particular example, the attenuation of emission from the tungsten layer alone, referred to herein as the W signal, by the $ZrO_2$ layer 125 is used to calculate the thickness of the unintended/unwanted zirconium-dioxide layer. An incident X-ray flux is used as a reference to normalize the W signal intensity (the terms signal intensity and electron count is used herein interchangeably). The resulting normalized electron count may be compared to reference electron count.

Figure 2:
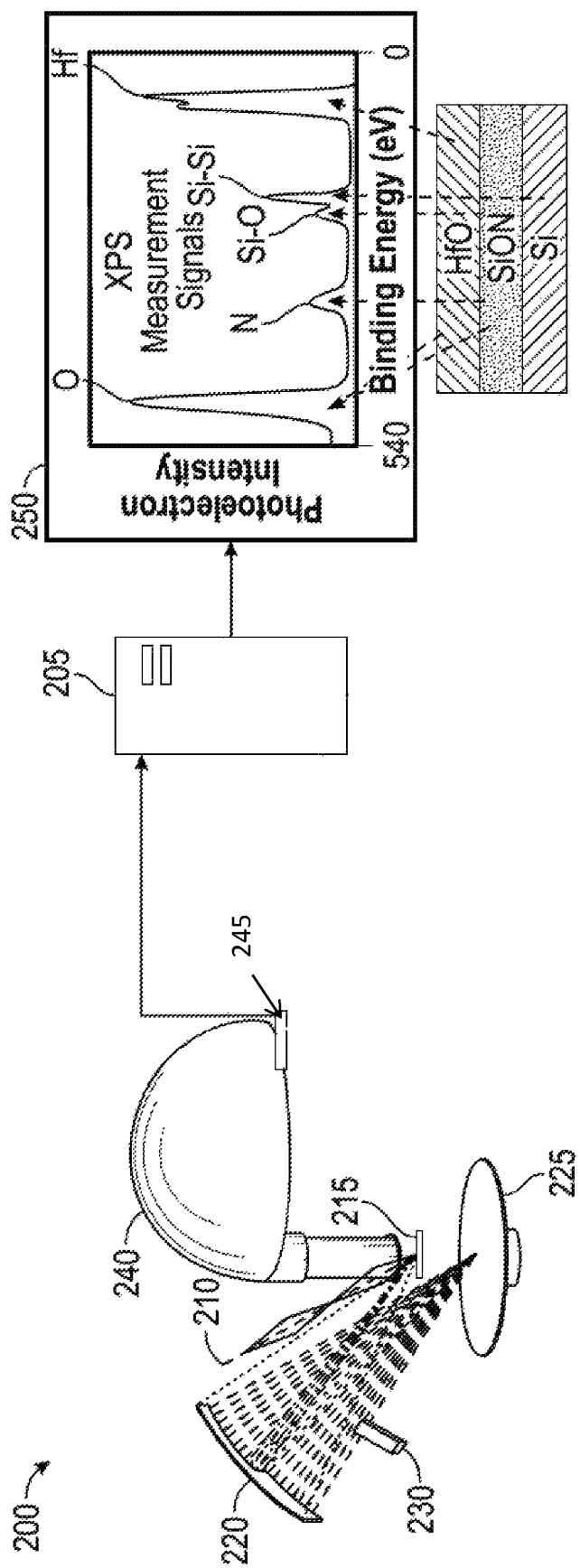
FIG. 2 illustrates a measurement device according to one embodiment.

FIG. 2 illustrates an example of an X-ray system 200 for the various embodiments disclosed herein for monitoring deposition processes. The operation of the system and the analysis described herein may be performed by one or more computers 205. An electron gun 210 emits electron beam which is directed to hit an anode 215, in this example made of aluminum. Consequently, X-rays are generated at the anode and are directed towards monochromator 220. The X-rays are then diffracted at the monochromator. In this example, monochromator 220 is made of crystal quartz that is configured to focus only Al Kα X-rays onto the wafer 225. A small amount of this Al Kα is also collected at flux detector 230. The signal of the flux detector 230 is converted from X-ray count into a flux number. The flux number is used as reference indicator of the X-ray hitting the wafer.

The primary Al Kα X-ray beam is directed to hit the wafer 235. As the X-ray pass through the layers of wafer 225, electrons and secondary X-rays are emitted from each of the layers of the wafer. An XPS energy analyzer 240 collects the emitted electrons and directs them towards the XPS detector 245. The XPS energy analyzer 240 generally separates the emitted electrons according to their energies, akin to a prism separating white light per photon frequencies. Consequently, the signal generated by the XPS detector 245 can be used to measure the number of electrons (i.e., intensity) at each specific energy. A sample graph generated by the computer 205 plotting intensity (number of electrons) v. binding energy is shown on monitor 250.

The plot exemplified in monitor 250 illustrates how the materials within the sample can be identified. In this particular example, the wafer 225 is made of silicon, and has a first layer of silicon-oxynitride and a layer of hafnium oxide over the silicon oxynitride. Various peaks in the plot can be used to identify the material present in the inspected sample, here wafer 225. In the example illustrated in FIG. 2 the silicon oxynitride is shown covering the entire silicon, and the hafnium oxide is shown covering the entire layer of silicon oxynitride. However, as discussed with respect to the example of FIG. 1, when the layers are deposited selectively, it is important to understand where each material is deposited and to what thickness.

According to one embodiment, the attenuation of the XPS signal from one layer is used to deduce the presence of a layer of different material over it. Moreover, the amount of attenuation can be used to quantify the thickness of the layer above. For example, looking at the XPS signal from the metal present in a metal layer (e.g., copper, tungsten, tantalum, etc.), any attenuation of this XPS signal may indicate the presence of unwanted oxide layer over the metal. This can indicate a loss of selectivity when depositing an oxide layer selectively over an oxide underlayer. Of course, the reverse can also be determined, i.e., using attenuation of XPS signal from an oxide layer can be used to detect metal being deposited over the oxide, and the thickness of such unwanted metal layer.

In disclosed embodiments the thickness of this unwanted oxide is estimated based on the measured XPS signal from the metal. The thickness is determined using the measured XPS signal obtained during the measurement, the X-ray flux obtained from the flux detector 230, and the expected XPS signal from the metal of interest when it has no oxide covering it (this can be known from experience, measured from a reference, measured prior to start of deposition of the oxide, etc.).

Turning for the specific example of FIG. 1, as exemplified in FIG. 1A, for an over-layer $ZrO_2$ of thickness $t_0$, a line from a species S (W or $SiO_2$ in FIG. 1A) will be attenuated as follows: $I_s = I_s' e^{(-t_0/\lambda_{s,ZrO2})}$, Where $I_s'$ (may sometimes be referred to as reference intensity or reference electron count) is the intensity of photoelectrons from species S prior to passing through layer $ZrO_2$, and $\lambda_{s,ZrO2}$ is a material parameter (effective attenuation length (EAL) for photoelectrons of a specific type from species S passing in material $ZrO_2$, e.g., silicon 2p photoelectrons emitted from silicon and passing through $ZrO_2$. In this disclosure the shorthand EAL for material A in material B may be used, but should be understood to refer to specific photoelectrons emitted from the material).

Based on this above equation, with known intensity of photoelectrons from S, we can estimate the thickness $t_0$ of layer $ZrO_2$ above it based on attenuation of photoelectrons emitted from S and passing through layer $ZrO_2$ by applying the material parameter to the natural log of the ratio of measured intensity calibrated for measured flux over expected intensity, thus: $t_0 = \lambda_{s,ZrO2} \text{Ln}((I_s/\text{X-ray Flux})/I_s')$.

This process can be used to find the thickness of deposited material (e.g., $ZrO_2$, HfO, etc.) over the intended patterned layer (e.g., $SiO_2$) and to find the thickness of deposited material over the unintended pattern layer (e.g., Si). For example, the method can be used to assess the deposition thickness achievable on selected surfaces without any deposition on neighboring surfaces, e.g., passivated/un-activated surfaces of the substrate. That is, so long as no deposition occurs over the unintended areas, no attenuation of the XPS signal from the material of that area should be observed.

Referring to FIG. 1 again, the generalized system of layers over the silicon substrate includes a first layer of material A having pattern of material B formed therein, and a deposited second layer having thickness $t_{thick}$ in intended areas over material A and potentially having thickness $t_{thin}$ in unintended areas over pattern of material B. The photoemissions from species A and B, having intensities $I_A$ and $I_B$, will be independently attenuated by the presence of layer of material C, which depends at least on the thickness of the deposited layer and the material making layer C. The effect of the material making layer C is referred to as effective attenuation length and is determined independently, e.g., experimentally. To determine the thickness of either $t_{thick}$ or $t_{thin}$ the measured intensities are normalized by the total incident X-ray flux on the substrate and corrected for the effective attenuation length. This can be done using the intensities $I_A$ and $I_B$ to determine both the thickness of the intended deposition and the thickness, if any, of the unintended deposition.

In the disclosed embodiments, the raw intensity numbers are not used directly, since there's a need to account for flux variation with each measurement and also variation from tool to tool. Therefore, the X-ray flux number is used to normalize the raw intensity to calculate the thickness. Also, the value of $I_s'$ can be used as a constant number that can be scaled based on the requirement or experience. For example, the value of $I_s'$ can be obtained by performing XPS measurement of the wafer prior to depositing the top layer, it may be the intensity of photo electrons per some unit of incident x-ray flux or at some nominal flux, etc. Also, since the thickness of the underlayer and the pattern layer (e.g., $SiO_2$ and W in FIG. 1) are relatively thick and constant from wafer to wafer, it is not necessary to measure $I_s'$ for each wafer. Rather, the value measure using a known good wafer can be stored for use in further measurements.

A measurement of the thickness of the desired deposited layer and unintended deposited sections (e.g., the thickness of the deposited ALD oxide on the $SiO_2$ and the thickness of the unwanted ALD oxide on the metal) can be obtained as follows. According to this embodiment, a multimaterial, multilayer thickness model is developed and the signals from all of these layers are used. For example, considering the structure illustrated in FIG. 1, the XPS signals corresponding to each of W, $SiO_2$ and $ZrO_2$ are used. A constant is generated to represent the effective contribution to intensity of each signal. A regression algorithm is then used to optimize a solution for thickness of the deposited layer and the thickness of the unwanted deposition that give the least residuals. Referring to the specific example of FIG. 1, the thickness of both the deposited zirconium dioxide over the $SiO_2$ regions the deposited zirconium dioxide over the tungsten W regions are calculated.

According to an embodiment, relationships defining the attenuation equations for each of the expected species are established. For example, in one general case, the deposited layer would be selectively deposited over a layer made of a first material, but may also unintentionally deposited over areas, e.g., a pattern, made of a second material embedded within the first material. Thus, the system can detect three signals: signal of species of the deposited material, attenuated signal from species of the first material and an attenuated signal (likely to a lesser extent) from species of the second material.

Referring to FIG. 1, the signal of species of the deposited material is the sum of the signal emitted from layer 115 (also indicated as C) and unintended part 125; the attenuated signal from the first material is signal IA, and the attenuated signal from the second material is IB. So, for this example one can set three equations: a first equation defining the signal, e.g., IA, of the first material as attenuated by a thick layer of the intended deposited material, a second equation defining the signal, e.g., $I_B$, of the second material as attenuated by a thin unintended layer of the deposited material, and a third equation defining the signal of the deposited material 115 with an added contribution from the unintended deposited material 125, each having "self" attenuation component, wherein photoelectrons emitted from deep within the layer are attenuated as it travels through the rest of the material of the layer.

To illustrate, the equations are developed with reference to example of FIG. 1, where there are three layers of concern: a zirconium dioxide layer being selectively deposited over the silicon dioxide and potentially a thin layer of zirconium dioxide being deposited over the tungsten layer. Therefore, the XPS signal of the tungsten may be attenuated by the unintended thin layer of zirconium dioxide and can be expressed as:

$I_W = 1/K_W * Exp(-tZrO_{2Thin}/EAL_{W\_Zr})$, wherein $K_W$ is a constant representing the effective contribution of tungsten to the intensity of the signal, $tZrO_{2Thin}$ is the thickness of the thin unintended zirconium dioxide layer, and $EAL_{W\_Zr}$ is the effective attenuation length of electrons emitted from tungsten and travel through zirconium dioxide. Thus, the attenuated signal of tungsten through the unintended thin layer is expressed as an exponent of the ratio of the thickness of the thin layer over the effective attenuation length of tungsten through zirconium dioxide; scaled by a tungsten scaling factor.

The total XPS signal of electrons emitted from the zirconium atoms (representing the zirconium dioxide layer) is the sum of the contribution from the thick parts deposited over the silicon and thin parts deposited over the tungsten, and can be expressed as:

$I_{Zr} = 1/K_{Zr} * (1 - Exp(-tZrO_{2Thick}/EAL_{Zr\_Zr})) + 1/K_{Zr} * (1 - Exp(-tZrO_2 Thin/EAL_{Zr\_Zr}))$; wherein $K_{Zr}$ is a constant representing the effective contribution of Zirconium electrons to the intensity of the signal, $tZrO_{2Thick}$ is the thickness of the intended zirconium dioxide layer, $tZrO_{2Thin}$ is the thickness of the unintended zirconium dioxide layer, and $EAL_{Zr\_Zr}$ is the effective attenuation length of electrons emitted from zirconium and travel through zirconium dioxide (electrons emitted from zirconium atoms at the bottom of the layer are attenuated by the remainder thickness of the layer above it). Thus, the attenuated signal of zirconium is the sum of the attenuated signal through the deposited thick layer and the attenuated signal through the unintended thin layer, and is expressed as: the sum of an exponent of the ratio of the thickness of the thick layer over the effective attenuation length of zirconium, scaled by a zirconium scaling factor and an exponent of the ratio of the thickness of the thin layer over the effective attenuation length of zirconium, scaled by a zirconium scaling factor.

The XPS signal of the silicon dioxide may be attenuated by the thick layer of zirconium dioxide and can be expressed as:

$I_{SiO} = 1/K_{SiO2} * Exp(-tZrO_{2Thick}/EAL_{SiO2\_Zr})$; wherein $K_{SiO}$ is a constant representing the effective contribution of silicon electrons to the intensity of the signal, $tZrO_{2Thick}$ is the thickness of the intended zirconium dioxide layer, and $EAL_{SiO2\_Zr}$ is the effective attenuation length of electrons emitted from silicon and travel through the thick zirconium dioxide layer. Thus, the attenuated signal of silicon through the deposited thick layer is expressed as an exponent of the ratio of the thickness of the thick layer over the effective attenuation length of silicon through zirconium dioxide; scaled by a silicon scaling factor.

Consequently, there are three equations that can be solved to determine the two unknowns: the thickness of the zirconium dioxide layer properly deposited over the silicon dioxide and the thickness (if any) of the zirconium dioxide deposited over the tungsten.

In one example, the total contribution of $I_{Zr}$ is normalized using the intensities of $I_w$ and $I_{SiO}$. The expressions are solved to minimize the residual by changing the $ZrO_{2Thick}$ and $ZrO_{2thin}$ which represent $ZrO_2$ deposition on $SiO_2$ and W respectively.

Minimizing to solve for solution $ZrO_{2Thick}$ and $ZrO_{2Thin}$:

$$Residual = \frac{\left[\left(\frac{I_{Zr}}{I_{SiO}}\right) - \left(\frac{\#Zr}{\#SiO}\right)\right]^2}{\left[\frac{\#Zr}{\#SiO}\right]^2} + \frac{\left[\left(\frac{I_{Zr}}{I_W}\right) - \left(\frac{\#Zr}{\#W}\right)\right]^2}{\left[\frac{\#Zr}{\#W}\right]^2}.$$

Wherein #Zr, #SiO and #W represent the electron count (the area under the curve illustrated on monitor 250 in FIG. 2), or XPS signal intensity, for zirconium, $SiO_2$ and W, respectively. The values, $K_{Zr}$, $K_{SiO}$ and $K_W$ can be obtained by, e.g., making XPS measurements prior to deposition of zirconium or measurements on other reference samples. In one example regression, e.g., non-linear regression, is used to find values of $tZrO_{2Thick}$ and $tZrO_{2Thin}$ that minimize the residual error between the measured raw spectra ratios (e.g., #Zr/#SiO and #Zr/#W) and the modeled or estimated photoemission intensity ratios (e.g., $I_{Zr}/I_{SiO}$ and $I_{Zr}/I_W$), as obtained by the expressions noted above.

For example, different thickness can be iteratively used in the expressions to generate different values for modeled intensities $I_W$, $I_{Zr}$ and $I_{SiO}$, and the resulting values of $I_W$, $I_{Zr}$ and $I_{SiO}$ are then plugged into the residual equation until the value of the residual is minimized. The predicated thickness corresponding to the values of $I_W$, $I_{Zr}$ and $I_{SiO}$ that minimize the residual are taken as the correct or true thickness of the deposited layer.

In disclosed embodiments, the deposition process in a sample having a first layer of a first material deposited over a second layer of a second material, wherein the second layer having a pattern of a third material therein, can be performed by determining the presence of the first material over the pattern of the third material by using measured X-ray flux value to normalize the electron count of electron energies corresponding to electrons emitted from the pattern of the third material, and comparing resulting normalized electron count to reference electron count.

Further, the method may proceed by calculating the thickness of the deposited layer over areas of the sample occupied by the second material and the thickness of the deposited layer (if any) over areas of the sample occupied by the pattern of third material. The thicknesses may be calculated by: irradiating the sample with an X-ray beam and collecting photo electrons emitted from the first, second and third materials of the sample, to thereby generate intensity values $I_1$, $I_2$ and $I_3$, respectively. Then, using reference intensities $I'_1$, $I'_2$ and $I'_3$, determining the respective thicknesses. The reference intensities are values obtain prior to depositing following layer, or values expected from a "golden" reference sample. For example, $I'_2$ can be obtain by measuring the XPS signal prior to or after forming the pattern of third material, but prior to depositing the first layer of first material. Similarly, $I'_3$ can be obtained by measuring the XPS signal after forming the pattern of third material, but prior to depositing the first material.

The value of $I_1$ is expressed as an added contribution from the thick layer over the second material and the thin layer (if any) over the third material. Each of $I_1$, $I_2$ and $I_3$ are expressed as a function of the reference intensities $I'_1$, $I'_2$ and $I'_3$, modified by an atomic sensitivity value corresponding to each of the first, second and third materials, and the effective attenuation length corresponding to electrons emitted from each of the first, second and third materials and traveling through a corresponding material above it. The atomic sensitivity values and effective attenuation length values can be determined experimentally.

The signal of photoelectrons of the third material, may be normalized using the signals from the first and second materials. For example, since the second layer and the pattern are normally thick, and do not vary between wafer to wafer, they can be used as a reference to normalize the signal from the deposited layer. For example, the two contributions from the thick and thin parts of the deposited first layer can be normalized by taking the ratios $I_1/I_2$ and $I_1/I_3$.

By disclosed methods, a first thickness of a first layer deposited over the second layer and a second thickness of the first layer deposited over a pattern within the second layer are determined by using the electron count for each of the electron energies to generate intensity values $I_1$, $I_2$ and $I_3$, corresponding to photo electrons emitted from the first, second and third materials, respectively; calculating modeled intensities $I'_1$, $I'_2$ and $I'_3$, corresponding to photo electrons emitted from the first, second and third materials using iterative estimated thicknesses values for the first thickness and second thickness; and minimizing difference between measured ratios of intensity values $I_1$, $I_2$ and $I_3$, and ratios of the modeled intensities $I'_1$, $I'_2$ and $I'_3$, to thereby obtain true values of the first thickness and second thickness. The methods may further include expressing each of the intensity values $I_1$, $I_2$ and $I_3$, as a function of the modeled intensities $I_1$, $I'_2$ and $I'_3$, an associated atomic sensitivity factor of each of the first, second and third materials, and an effective attenuation length of photoelectron emitted from each of the first, second and third materials, and using values obtained from the minimizing step to obtain the first thickness and the second thickness. The minimizing step may comprise performing a regression on the difference between measured ratios and the ratios of modeled intensities.

Also, a first thickness of the first layer deposited over the second layer and a second thickness of the first layer deposited over the pattern within the second layer may be determined by: using the electron count for each of the electron energies to generate intensity values $I_1$, $I_2$ and $I_3$, corresponding to photo electrons emitted from the first, second and third materials, respectively; setting expected intensity $I'_1$ as corresponding to a sum of a first contribution of emission from thick part of the first layer deposited over the second material and correlated to the first thickness and second contribution of emission from a thin part of the first layer deposited over the third material and correlated to the second thickness, wherein a material constant of the first material and an effective attenuation length of the first material is applied to each of the first contribution and the second contribution; setting expected intensity $I'_2$ as corresponding to photo electrons emission from the second layer and passing through the first thickness and adjusted by a material constant of the second material and an effective attenuation length of emission from the second material; setting expected intensity $I'_3$ as corresponding to photo electrons emission from the pattern and passing through the second thickness and adjusted by a material constant of the third material and an effective attenuation length of emission from the third material; and using the intensity values $I_1$, $I_2$ and $I_3$ and the expected $I'_1$, $I'_2$ and $I'_3$ to obtain the first thickness and the second thickness. Further, the thickness may be determined by iteratively calculating the expected intensities $I'_1$, $I'_2$ and $I'_3$ by using different estimated values for the first thickness and the second thickness; for each iteration determining a residual value between intensity values $I_1$, $I_2$ and $I_3$ and the expected $I'_1$, $I'_2$ and $I'_3$; and setting the estimated value for the first thickness and the second thickness that generates the smallest residual value as true first thickness and second thickness.

It should be understood that processes and techniques described herein are not inherently related to any particular apparatus and may be implemented by any suitable combination of components. Further, various types of general purpose devices may be used in accordance with the teachings described herein. The present invention has been described in relation to particular examples, which are intended in all respects to be illustrative rather than restrictive. Those skilled in the art will appreciate that many different combinations will be suitable for practicing the present invention.

Moreover, other implementations of the invention will be apparent to those skilled in the art from consideration of the specification and practice of the invention disclosed herein. Notably, the expressions disclosed herein are provided as examples for the specific geometries of patterned layers as shown in the disclosed examples. Various aspects and/or components of the described embodiments may be used singly or in any combination. It is intended that the specification and examples be considered as exemplary only, with a true scope and spirit of the invention being indicated by the following claims.

The invention claimed is:

1. A method for monitoring deposition process, comprising:
   providing a sample having a first layer of a first material deposited over a second layer of a second material, the second layer having a pattern of a third material therein;
   generating an X-ray beam and directing the X-ray beam towards the sample to irradiate the sample;
   intercepting part of the X-ray beam with an X-ray detector to generate an X-ray flux value;
   collecting electrons emitted from the sample and separating the electrons according to electron energies;
   determining electron count for each of the electron energies;
   determining the presence of the first material over the pattern of the third material by using the X-ray flux value to normalize the electron count of electron energies corresponding to electrons emitted from the pattern of the third material, and comparing resulting normalized electron count to reference electron count;
   wherein a first thickness of the first layer deposited over the second layer and a second thickness of the first layer deposited over the pattern are determined by:
   using the electron count for each of the electron energies to generate intensity values $I_1$, $I_2$ and $I_3$, corresponding to photo electrons emitted from the first, second and third materials, respectively;
   calculating modeled intensities $I'_1$, $I'_2$ and $I'_3$, corresponding to photo electrons emitted from the first, second and third materials using iterative estimated thicknesses values for the first thickness and second thickness;
   minimizing difference between measured ratios of intensity values $I_1$, $I_2$ and $I_3$, and ratios of the modeled intensities $I''_1$, $I'_2$ and $I'_3$, to thereby obtain true values of the first thickness and second thickness.

2. The method of claim 1, wherein comparing resulting normalized electron count to reference electron count comprises obtaining a ratio of the resulting normalized electron count to reference electron count.

3. The method of claim 2, further comprising determining the thickness of the first layer over the pattern by scaling a natural log of the ratio.

4. The method of claim 3, wherein scaling comprises multiplying by an effective attenuation length of photoelectrons emitted from the third material and traveling through the first material.

5. The method of claim 1, further comprising determining the thickness of the first layer over the second material by using the X-ray flux value to normalize the electron count of electron energies corresponding to electrons emitted from the second material, and applying a correction factor.

6. The method of claim 5, wherein the correction factor comprises an effective attenuation length of photoelectrons emitted from the second material and traveling through the first material.

7. The method of claim 1, wherein the first and second materials are dielectric and the third material is a conductor, or the first and second materials are conductors and the third material is a dielectric.

8. The method of claim 7, wherein providing the sample comprises performing self-aligned deposition process to deposit the first layer over the second layer.

9. The method of claim 1, wherein the reference electron count is obtained by irradiating a reference sample prior to depositing the second layer.

10. The method of claim 1, further comprising expressing each of the intensity values $I_1$, $I_2$ and $I_3$, as a function of the modeled intensities $I''_1$, $I'_2$ and $I'_3$, an associated atomic sensitivity factor of each of the first, second and third materials, and an effective attenuation length of photoelectron emitted from each of the first, second and third materials, and using values obtained from the minimizing step to obtain the first thickness and the second thickness.

11. The method of claim 1, wherein the minimizing step comprises performing a regression on the difference between measured ratios and the ratios of modeled intensities.

12. The method of claim 11, wherein the difference between measured ratios and the ratios of modeled intensities is expressed as: $[(I'_1/I'_2)-(I_1/I_2)]$ and $[(I'_1/I'_3)-(I_1/I_3)]$.

13. The method of claim 11, wherein performing a regression comprises performing a non-linear regression to minimize the expression:

$$\{[(I'_1/I'_2)-(I_1/I_2)]^2\}/(I_1/I_2)^2 + \{[(I'_1/I'_3)-(I_1/I_3)]^2\}/(I_1/I_3)2.$$

14. A method for monitoring deposition process comprising:
   providing a sample having a first layer of a first material deposited over a second layer of a second material, the second layer having a pattern of a third material therein;
   generating an X-ray beam and directing the X-ray beam towards the sample to irradiate the sample;
   intercepting part of the X-ray beam with an X-ray detector to generate an X-ray flux value;
   collecting electrons emitted from the sample and separating the electrons according to electron energies;
   determining electron count for each of the electron energies;
   determining the presence of the first material over the pattern of the third material by using the X-ray flux value to normalize the electron count of electron energies corresponding to electrons emitted from the pattern of the third material, and comparing resulting normalized electron count to reference electron count;

wherein a first thickness of the first layer deposited over the second layer and a second thickness of the first layer deposited over the pattern are determined by:

using the electron count for each of the electron energies to generate intensity values $I_1$, $I_2$ and $I_3$, corresponding to photo electrons emitted from the first, second and third materials, respectively;

setting expected intensity $I'_1$ as corresponding to a sum of a first contribution of emission from thick part of the first layer deposited over the second material and correlated to the first thickness and second contribution of emission from a thin part of the first layer deposited over the third material and correlated to the second thickness, wherein a material constant of the first material and an effective attenuation length of the first material is applied to each of the first contribution and the second contribution;

setting expected intensity $I'_2$ as corresponding to photo electrons emission from the second layer and passing through the first thickness and adjusted by a material constant of the second material and an effective attenuation length of emission from the second material;

setting expected intensity $I'_3$ as corresponding to photo electrons emission from the pattern and passing through the second thickness and adjusted by a material constant of the third material and an effective attenuation length of emission from the third material;

using the intensity values $I_1$, $I_2$ and $I_3$ and the expected $I'_1$, $I'_2$ and $I'_3$ to obtain the first thickness and the second thickness.

15. The method of claim 14, comprising:

iteratively calculating the expected intensities $I'_1$, $I'_2$ and $I'_3$ by using different estimated values for the first thickness and the second thickness;

for each iteration determining a residual value between intensity values $I_1$, $I_2$ and $I_3$ and the expected $I'_1$, $I'_2$ and $I'_3$;

setting the estimated value for the first thickness and the second thickness that generates the smallest residual value as true first thickness and second thickness.

16. A method for monitoring deposition process, comprising:

providing a sample having a first layer including a thin part and a thick part of a first material deposited over a second layer of a second material, the second layer having a pattern of a third material therein;

generating an X-ray beam and directing the X-ray beam towards the sample to irradiate the sample;

collecting electrons emitted from the sample and separating the electrons according to electron energies;

determining electron count for electron energies corresponding to electrons emitted from species of the first material, second material and third material;

using the electron count to generate intensity values $I_1$, $I_2$ and $I_3$, corresponding to photo electrons emitted from the first, second and third materials, respectively;

expressing model value of electrons emitted from species of the first material as $I'_1$, corresponding to a sum of a first contribution correlated to the thickness of the thick part and second contribution correlated to the thickness of the thin part, wherein a material constant of the first material and an effective attenuation length of the first material is applied to each of the first contribution and the second contribution;

expressing model value of electrons emitted from species of the second material as $I'_2$, corresponding to thickness of the thick part and adjusted by a material constant of the second material and an effective attenuation length of the second material;

expressing model value of electrons emitted from species of the third material as $I'_3$, corresponding to thickness of the thin part and adjusted by a material constant of the third material and an effective attenuation length of the third material;

using the intensity values $I_1$, $I_2$ and $I_3$ and models values $I'_1$, $I'_2$ and $I'_3$ to obtain the thickness of the thick part and the thickness of the thin part.

17. The method of claim 16, wherein adjusted by a material constant and an effective attenuation length for each corresponding material comprises applying the material constant to an exponent of the ratio of the thickness over the effective attenuation length.

18. The method of claim 16, further comprising applying non-linear regression to ratio differences of $I_1$, $I_2$ and $I_3$, and $I'_1$, $I'_2$ and $I'_3$.

* * * * *